United States Patent
Inaba

(10) Patent No.: US 9,515,183 B2
(45) Date of Patent: Dec. 6, 2016

(54) SEMICONDUCTOR DEVICE INCLUDING BURIED-GATE MOS TRANSISTOR WITH APPROPRIATE STRESS APPLIED THERETO

(71) Applicant: Satoshi Inaba, Seongnam-si (KR)

(72) Inventor: Satoshi Inaba, Seongnam-si (KR)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/842,998

(22) Filed: Sep. 2, 2015

(65) Prior Publication Data

US 2016/0268432 A1    Sep. 15, 2016

Related U.S. Application Data

(60) Provisional application No. 62/131,764, filed on Mar. 11, 2015.

(51) Int. Cl.
    *H01L 29/423*    (2006.01)
    *H01L 27/24*     (2006.01)
    (Continued)

(52) U.S. Cl.
    CPC ..... *H01L 29/7849* (2013.01); *H01L 29/41758* (2013.01); *H01L 29/4236* (2013.01)

(58) Field of Classification Search
    CPC .......... H01L 29/41758; H01L 29/4236; H01L 29/7849
    See application file for complete search history.

(56) References Cited

U.S. PATENT DOCUMENTS 6,495,883 B2 *  12/2002  Shibata .............. H01L 29/045
                                                    257/331
7,649,232 B2    1/2010   Tamura et al.
(Continued)

FOREIGN PATENT DOCUMENTS

JP        2013065590 A    4/2013

OTHER PUBLICATIONS

Atsushi Yagishita, et al., "Schottky Barrier Height Reduction and Drive Current Improvement in Metal Source/Drain MOSFET with Strained-Si Channel", Japanese Journal of Applied Physics, vol. 43, No. 4B, 2004, pp. 1713-1716.
(Continued)

*Primary Examiner* — Thomas L Dickey
*Assistant Examiner* — Damon Hillman
(74) *Attorney, Agent, or Firm* — Holtz, Holtz & Volek PC

(57) ABSTRACT

According to one embodiment, a semiconductor device includes a semiconductor substrate having a trench and including an active area including a channel area formed along an inner surface of the trench and source/drain areas formed at both ends of the channel area and sandwiching the trench, a gate insulating film formed on the inner surface of the trench, and a gate electrode formed in the trench in which the gate insulating film is provided. A main surface of the semiconductor substrate has {100} plane orientation, a portion of the channel area parallel to a side surface of the trench has {110} channel plane orientation and has <100> channel orientation in a channel length direction, and tensile stress in the channel length direction and compressive stress in a channel width direction are applied to the portion of the channel area parallel to the side surface of the trench.

23 Claims, 10 Drawing Sheets

(51) Int. Cl.
  *H01L 21/28* (2006.01)
  *H01L 29/78* (2006.01)
  *H01L 29/417* (2006.01)

(56) References Cited

U.S. PATENT DOCUMENTS

| | | | | |
|---|---|---|---|---|
| 2008/0185658 | A1* | 8/2008 | Ieong | H01L 29/78696 257/369 |
| 2011/0042724 | A1* | 2/2011 | Bhalla | H01L 29/045 257/255 |
| 2013/0075797 | A1 | 3/2013 | Okano | |
| 2014/0001525 | A1 | 1/2014 | Kajiyama | |
| 2015/0069317 | A1* | 3/2015 | Inaba | H01L 29/4236 257/4 |
| 2015/0340453 | A1* | 11/2015 | Cho | H01L 29/423 257/330 |
| 2016/0043187 | A1* | 2/2016 | Saito | H01L 29/2003 257/76 |

OTHER PUBLICATIONS

F. Andrieu, et al., "Comparative Scalability of PVD and CVD TiN on HfO2 as a Metal Gate Stack for FDSOI cMOSFETs down to 25nm Gate Length and Width", Electron Devices Meeting, Dec. 11-13, 2006, pp. 1-4.

Naoki Yamamoto, et al., "The Influence of Internal Stresses in Tungsten-Gate Electrodes on the Degradation of MOSFET Characteristics Caused by Hot Carriers", IEEE Transactions on Electron Devices, vol. ED-34, No. 3, Mar. 1987, pp. 607-614.

P. Packan, et al., "High Performance Hi-K + Metal Gate Strain Enhanced Transistors on (110) Silicon", Electron Devices Meeting, Dec. 15-17, 2008, pp. 1-4.

U.S. Appl. No. 14/453,316, filed Aug. 6, 2014, First Named Inventor: Satoshi Inaba, Title: "Semiconductor Device and Method of Manufacturing the Same".

S. Takagi, et al., "Channel Structure Design, Fabrication and Carrier Transport Properties of Strained-Si/SiGe-On-Insulator (Strained-SOI) MOSFETs", Electron Devices Meeting, Dec. 8-10, 2003, pp. 3.3.1-3.3.4.

* cited by examiner

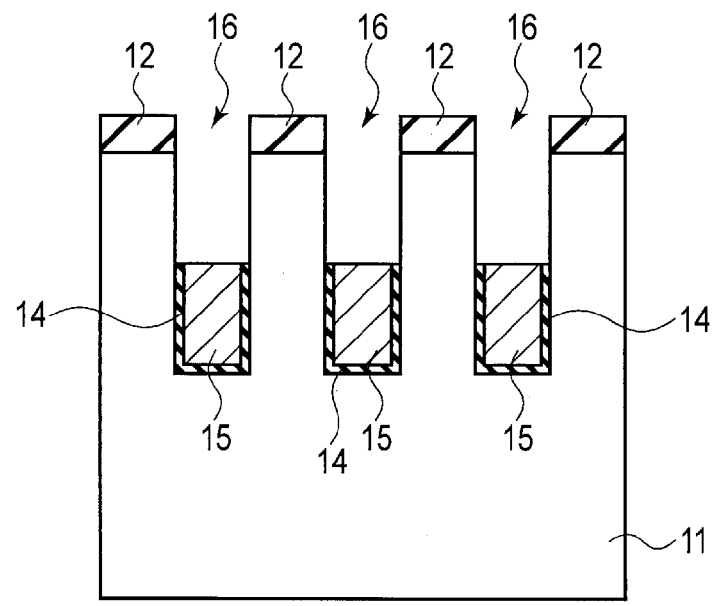
F I G. 3
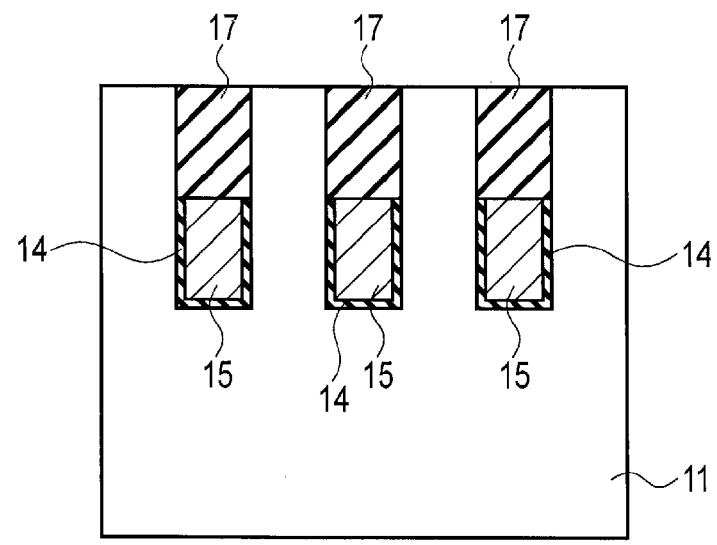
F I G. 4

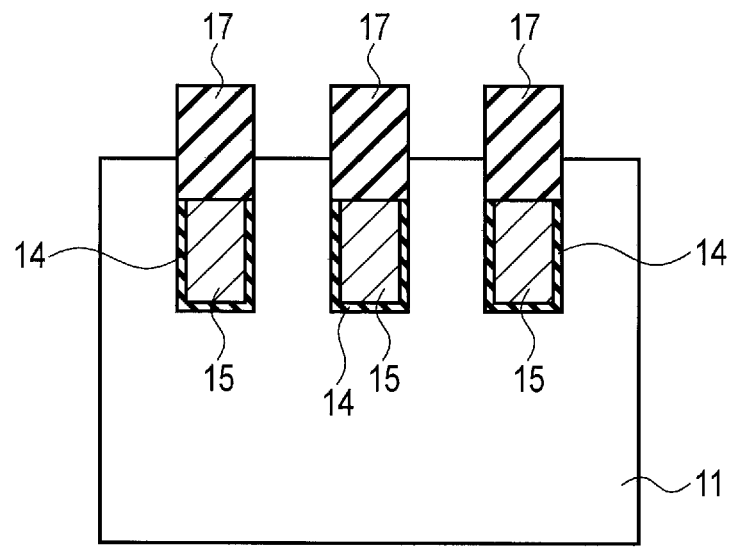
F I G. 5
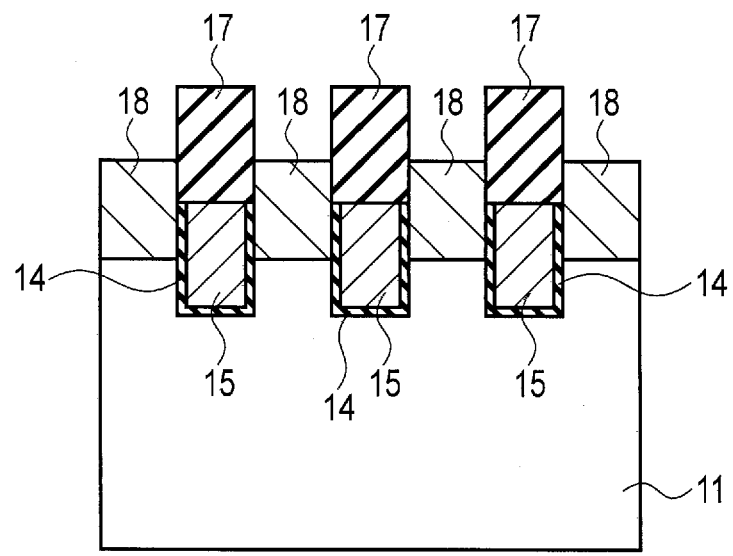
F I G. 6

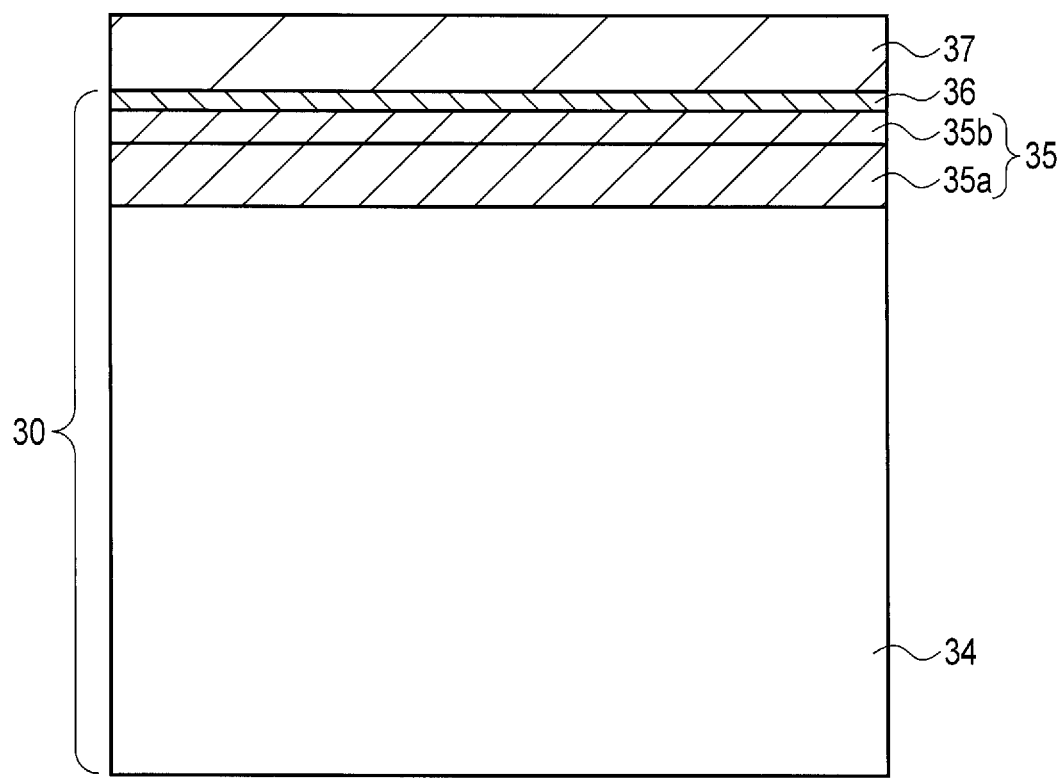
F I G. 17

SEMICONDUCTOR DEVICE INCLUDING BURIED-GATE MOS TRANSISTOR WITH APPROPRIATE STRESS APPLIED THERETO

CROSS-REFERENCE TO RELATED APPLICATIONS

This application claims the benefit of U.S. Provisional Application No. 62/131,764, filed Mar. 11, 2015, the entire contents of which are incorporated herein by reference.

FIELD

Embodiments described herein relate generally to a semiconductor device.

BACKGROUND

As buried-gate MOS transistors do not have a normal gate sidewall spacer portion, the contact area on the active area can be maximized. Thus, the resistance can be lowered, thereby enhancing the current drive performance.

However, in the conventional buried-gate MOS transistors, optimization of electron mobility in the channel area or optimization of resistance in the contact area is not necessarily realized. Thus, the current drive performance is not necessarily enhanced in the conventional buried-gate MOS transistors.

In consideration of these problems, a semiconductor device which can further enhance the current drive performance is desired.

BRIEF DESCRIPTION OF THE DRAWINGS

FIG. 3 is a cross-sectional view schematically showing a part of the basic method for manufacturing the buried-gate MOS transistor.

FIG. 4 is a cross-sectional view schematically showing a part of the basic method for manufacturing the buried-gate MOS transistor.

FIG. 5 is a cross-sectional view schematically showing a part of the basic method for manufacturing the buried-gate MOS transistor.

FIG. 6 is a cross-sectional view schematically showing a part of the basic method for manufacturing the buried-gate MOS transistor.

FIG. 17 is a cross-sectional view schematically showing a part of a method for manufacturing the semiconductor device according to the third embodiment.

DETAILED DESCRIPTION

In general, according to one embodiment, a semiconductor device includes: a semiconductor substrate having a trench and including an active area, the active area including a channel area formed along an inner surface of the trench and source/drain areas formed at both ends of the channel area and sandwiching the trench; a gate insulating film formed on the inner surface of the trench; and a gate electrode formed in the trench in which the gate insulating film is provided, wherein a main surface of the semiconductor substrate has a plane orientation of $\{100\}$, a portion of the channel area parallel to a side surface of the trench has a channel plane orientation of $\{110\}$ and has a channel orientation of $<100>$ in a channel length direction, and tensile stress in the channel length direction and compressive stress in a channel width direction are applied to the portion of the channel area parallel to the side surface of the trench.

Embodiments will be described hereinafter with reference to the accompanying drawings.

Embodiment 1

FIG. 1 to FIG. 6 are cross-sectional views schematically showing a basic method for manufacturing a buried-gate MOS transistor.

Figure 1:
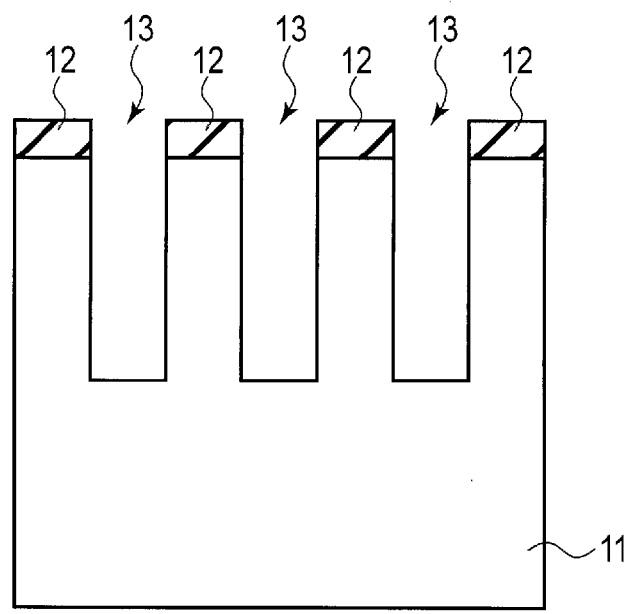
FIG. 1 is a cross-sectional view schematically showing a part of a basic method for manufacturing a buried-gate MOS transistor.

First, as shown in FIG. 1, a mask portion 12 is formed on a semiconductor substrate 11. The mask portion 12 is used as a mask to etch the semiconductor substrate 11. In this manner, a trench 13 is formed in the semiconductor substrate 11.

Figure 2:
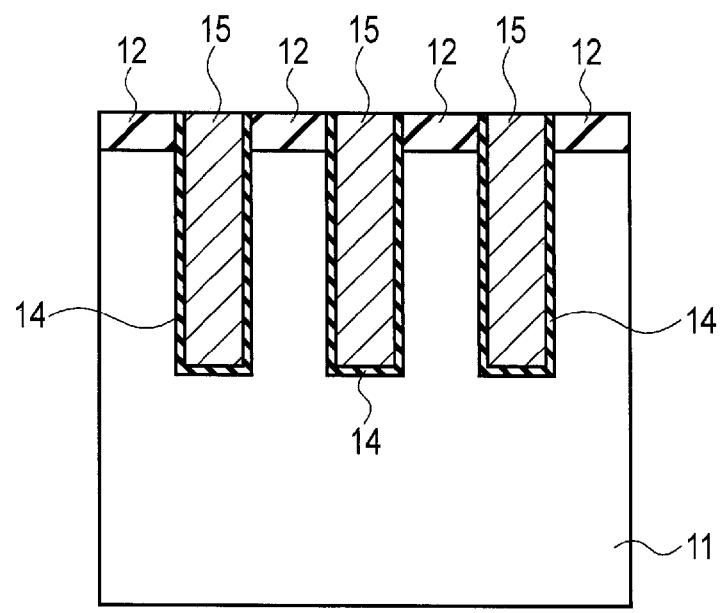
FIG. 2 is a cross-sectional view schematically showing a part of the basic method for manufacturing the buried-gate MOS transistor.

Subsequently, as shown in FIG. 2, a gate insulating film 14 is formed on the inner surface of the trench 13. Then, a gate electrode film 15 is deposited on the whole surface. Further, the gate electrode film 15 is planarized and is buried in the trench 13.

Subsequently, as shown in FIG. 3, the gate electrode film 15 is etched back, thereby forming a gate electrode 15 and a trench 16.

Subsequently, as shown in FIG. 4, a gate cap material film is formed on the whole surface. By planarizing the gate cap material film, a gate cap portion 17 is formed only in the trench 16.

Subsequently, as shown in FIG. 5, the semiconductor substrate 11 is etched back, thereby exposing a part of the gate cap portion 17.

Subsequently, as shown in FIG. 6, the gate cap portion 17 is used as a mask to impurity ion-implant into the semiconductor substrate 11. By this process, a source/drain area 18 is formed.

In the above manner, a buried-gate MOS transistor is formed.

Normally, the buried-gate MOS transistor is formed in a semiconductor substrate comprising a substrate surface (main surface) having a Miller index of {100}. Normally, the orientation of a direction perpendicular to a side surface of the gate electrode has a Miller index of <110>.

A Miller index of {100} represents a crystal plane orientation represented by a Miller index of (100) and a crystal plane orientation equivalent to a crystal plane orientation represented by a Miller index of (100). A Miller index of <110> represents a crystal orientation represented by a Miller index of [110] and a crystal orientation equivalent to a crystal orientation represented by a Miller index of [110]. In the following description, a crystal plane orientation is represented by {XXX}, and a crystal orientation is represented by <XXX>.

Now, this specification explores preferable stress to be applied to the channel area of a buried-gate MOS transistor; in other words, preferable stress to be applied to the channel area to enhance electron mobility.

In planar MOS transistors, preferable stress to be applied to the channel area has been already analyzed. With reference to the preferable stress to be applied to the channel area of a planar MOS transistor, this specification analyzes that of a buried-gate MOS transistor. In the following discussion, a case of an n-type MOSFET is basically considered.

As stated above, normally, a buried-gate MOS transistor is formed in a semiconductor substrate comprising a substrate surface (main surface) having a Miller index of {100}. The orientation of a direction perpendicular to a side surface of the buried gate electrode has a Miller index of <110>. In this case, with reference to a planar n-type MOS transistor, tensile stress is preferably applied in the channel length direction. Compressive stress is preferably applied in the channel width direction. Further, tensile stress is preferably applied in a direction perpendicular to the channel surface. By applying stress to the channel area in this manner, the electron mobility in the transistor may be enhanced.

Figure 7:
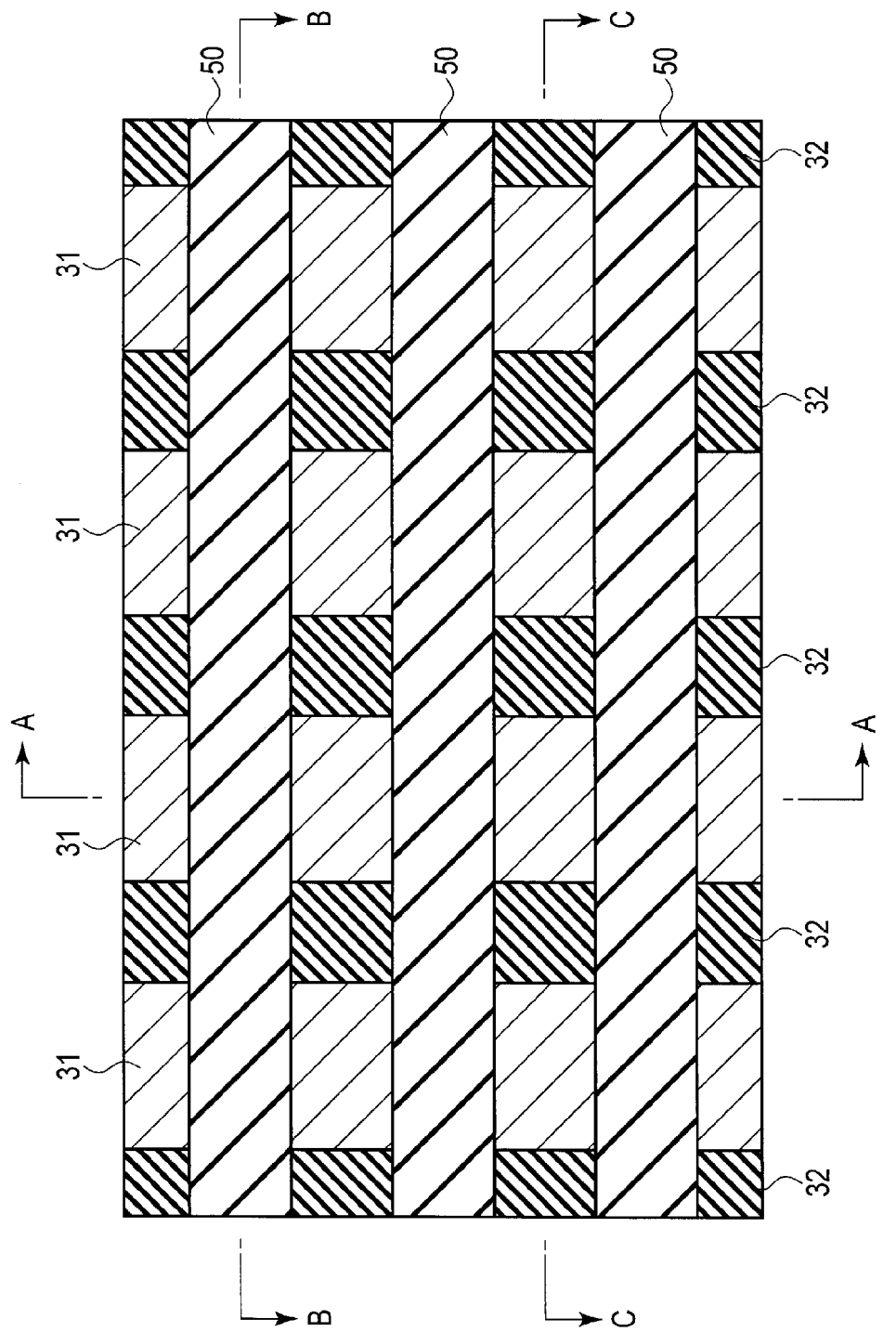
FIG. 7 is a plan view schematically showing the structure of a semiconductor device (buried-gate MOS transistor) according to first and second embodiments.

FIG. 7 is a plan view schematically showing the structure of a semiconductor device (buried-gate MOS transistor) according to the present embodiment.

Figure 8:
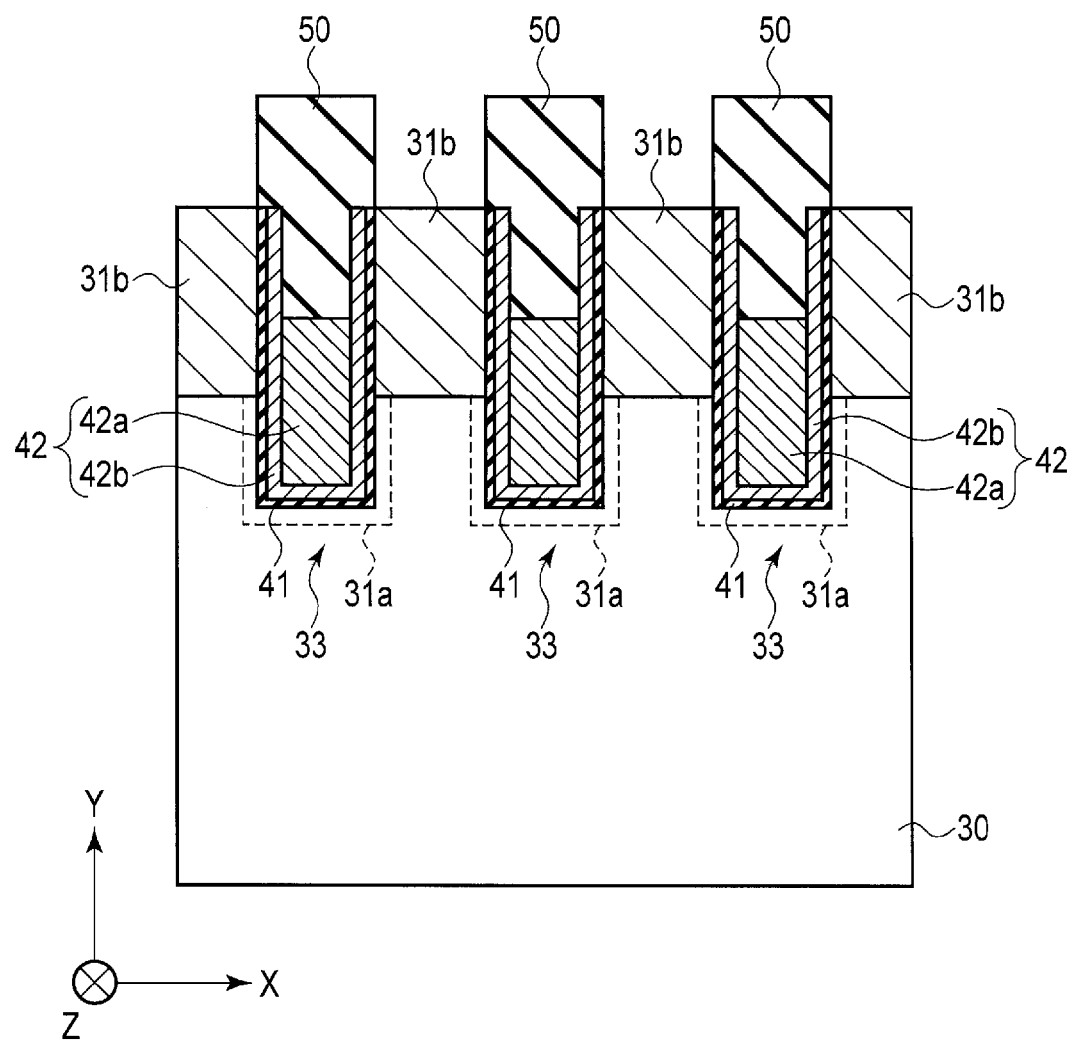
FIG. 8 is a cross-sectional view schematically showing the structure of the semiconductor device (buried-gate MOS transistor) according to the first and second embodiments.
Figure 9:
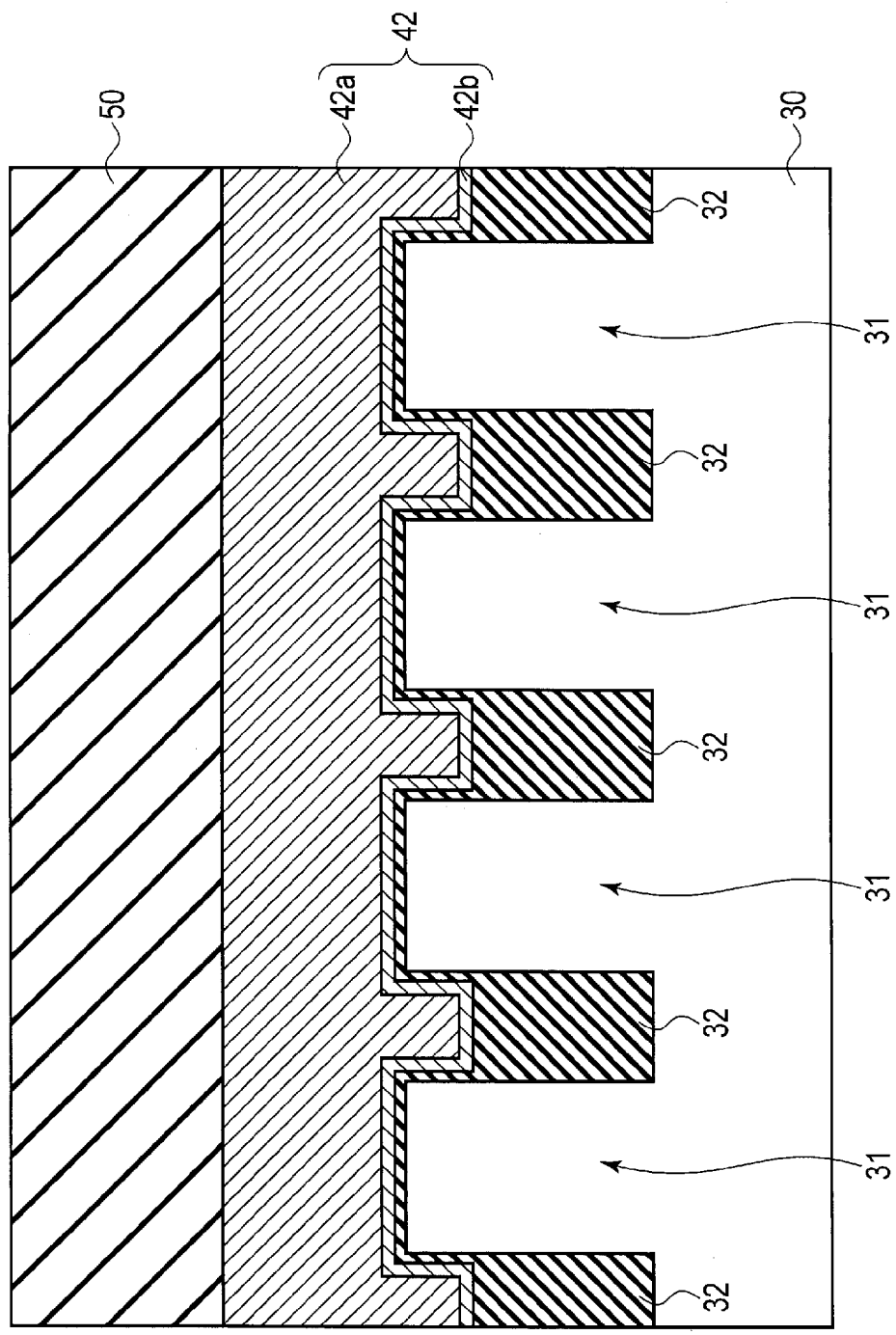
FIG. 9 is a cross-sectional view schematically showing the structure of the semiconductor device (buried-gate MOS transistor) according to the first and second embodiments.
Figure 10:
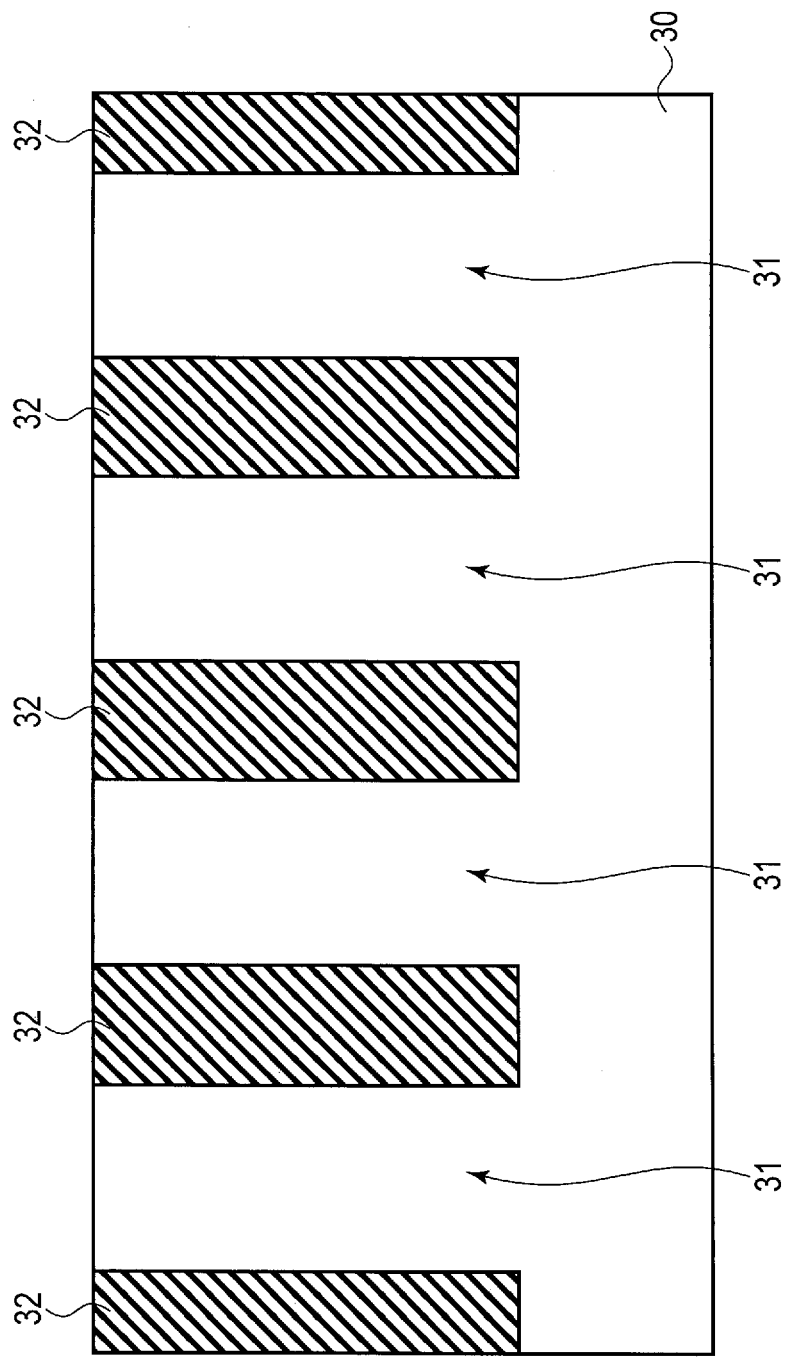
FIG. 10 is a cross-sectional view schematically showing the structure of the semiconductor device (buried-gate MOS transistor) according to the first and second embodiments.

FIG. 8, FIG. 9 and FIG. 10 are cross-sectional views taken along the line A-A, the line B-B and the line C-C of FIG. 7, respectively.

A semiconductor substrate 30 is a p-type silicon substrate and comprises an active area 31. Around the active area 31, an isolation area 32 is formed. The active area 31 is surrounded by the isolation area 32. The semiconductor substrate 30 has a trench 33. The active area 31 includes a channel area 31a and a source/drain area 31b. The channel area 31a is formed along the inner surface of the trench 33. The source/drain areas 31b are formed at both ends of the channel area 31a. The trench 33 is sandwiched by the source/drain areas 31b.

A gate insulating film 41 is formed on the inner surface of the trench 33. A gate electrode 42 is formed in the trench 33 provided with the gate insulating film 41. The gate electrode 42 includes a body portion 42a and a barrier metal portion 42b. The body portion 42a is formed of tungsten (W). The barrier metal portion 42b is formed of a titanium nitride (TiN).

On the gate electrode 42, a cap portion 50 is formed. The gap portion 50 is formed of a silicon nitride (SiN).

The main surface of the semiconductor substrate 30 has a crystal plane orientation of {100}. Thus, the crystal orientation of a direction perpendicular to the main surface of the semiconductor substrate 30 is <100>.

The portion of the channel area 31a parallel to a side surface of the trench 33 has a channel plane orientation of {110} and a channel orientation of <100> in the channel length direction. In other words, when x-, y- and z-axes (the z-axis being perpendicular to the paper plane) are defined as shown in FIG. 8, the portion of the channel area 31a parallel to a side surface of the trench 33 has a crystal orientation of <110> x-axially. The portion of the channel area 31a parallel to a side surface of the trench 33 has a crystal orientation of <100> y-axially.

The tensile stress in the channel length direction and the compressive stress in the channel width direction are applied to the portion of the channel area 31a parallel to a side surface of the trench 33. In other words, the y-axial tensile stress and the z-axial compressive stress are applied to the portion of the channel area 31a parallel to a side surface of the trench 33. The tensile stress in a direction perpendicular to a side surface of the trench 33 is applied to the portion of the channel area 31a parallel to a side surface of the trench 33. In other words, the x-axial tensile stress is applied to the portion of the channel area 31a parallel to a side surface of the trench 33.

In the buried-gate MOS transistor, the electron mobility in the channel area 31a can be enhanced by adopting the above structure.

To apply stress to the channel area 31a in the above manner, the following structure is employed in the present embodiment.

The gate electrode 42 preferably has compressive stress. In other words, the gate electrode 42 preferably has compressive stress in both the body portion 42a and the barrier metal portion 42b. The cap portion 50 also preferably has compressive stress.

FIG. 11 to FIG. 14 show two-dimensional simulation results of stress applied to the channel area of the buried-gate MOS transistor (in other words, stress in the channel length direction). FIG. 11 to FIG. 14 assume two gate structures (hereinafter, referred to as a gate structure 100) comprising two gate electrodes and two cap portions formed on the each gate electrode, and an active area located in-between two gate structures. FIG. 11 to FIG. 14 show simulation results of stress applied to the semiconductor area between the gate structures 100. The stress distribution is shown by four levels of A, B, C and D. In order to explain the degree of the stress amount and the direction, these four stress revels are defined to shift from compressive stress to tensile stress in the order of A, B, C and D.

Figure 11:
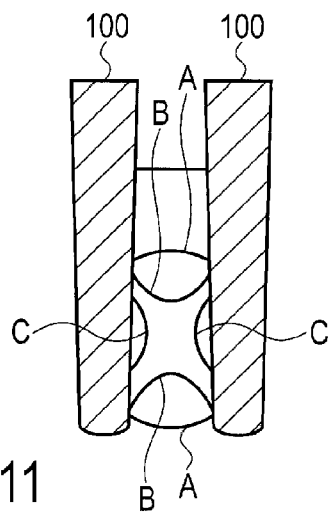
FIG. 11 shows a simulation result of stress applied to the channel area of the buried-gate MOS transistor according to the first embodiment.
Figure 12:
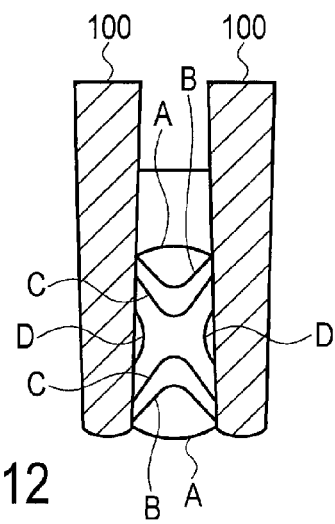
FIG. 12 shows a simulation result of stress applied to the channel area of the buried-gate MOS transistor according to the first embodiment.
Figure 13:
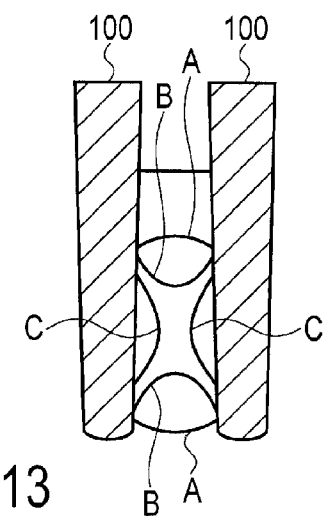
FIG. 13 shows a simulation result of stress applied to the channel area of the buried-gate MOS transistor according to the first embodiment.
Figure 14:
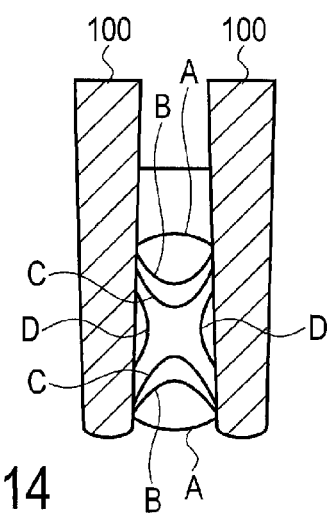
FIG. 14 shows a simulation result of stress applied to the channel area of the buried-gate MOS transistor according to the first embodiment.

FIG. 11 shows a case where the gate electrode 42 has tensile stress and the cap portion 50 has tensile stress. FIG. 12 shows a case where the gate electrode 42 has compressive stress and the cap portion 50 has tensile stress. FIG. 13 shows a case where the gate electrode 42 has tensile stress and the cap portion 50 has compressive stress. FIG. 14 shows a case where the gate electrode 42 has compressive stress and the cap portion 50 has compressive stress.

As is clear from FIG. 11 to FIG. 14, the tensile stress in the channel area increases in the order of FIG. 11, FIG. 13, FIG. 12 and FIG. 14. In other words, the tensile stress in the channel area is the greatest in the case of FIG. 14 and the least in the case of FIG. 11. Thus, when both the gate electrode and the cap portion have compressive stress, the tensile stress in the channel area is the greatest, thereby most enhancing the electron mobility in the channel area.

The stress in the gate electrode can be changed and adjusted in the following manner. This specification explains an example in which the body portion 42a and the barrier metal portion 42b of the gate electrode 42 are formed of tungsten (W) and a titanium nitride (TiN), respectively.

When tungsten is formed by a sputtering process, the compressive stress of tungsten increases with decrease in the pressure of an argon (Ar) gas in a film formation atmosphere. On the other hand, the tensile stress of tungsten increases with increase in the pressure of an argon (Ar) gas in a film formation atmosphere. Therefore, when the body portion 42a of the gate electrode 42 is formed of tungsten, the pressure of an argon gas in a film formation atmosphere is preferably small such that tungsten has compressive stress. By employing an appropriate film formation method selected from film formation methods such as CVD and PVD, a TiN film having compressive stress can be formed.

The stress of the cap portion 50 can be changed in the following manner. For example, when the cap portion 50 is formed of a silicon nitride (SiN), the stress of the cap portion 50 can be changed by changing the composition ratio of silicon (Si) and nitrogen (N). Specifically, the cap portion 50 can have compressive stress when the composition ratio of, silicon is high.

To control the stress applied in the channel width direction of the channel area, the stress of the isolation area 32 should be preferably controlled. Specifically, if the isolation area 32 has tensile stress, it is possible to apply compressive stress in the channel width direction of the channel area. To control the stress of the isolation area 32, the stress of the liner nitride film formed under the isolation area 32 using a silicon oxidized film may be controlled. If the liner nitride film has tensile stress, it is possible to apply tensile stress to the silicon oxidized film (isolation area 32) formed on the liner nitride film.

As described above, according to the present embodiment, the electron mobility and the current driving performance can be enhanced by appropriately applying stress to the channel area in the buried-gate MOS transistor.

Embodiment 2

Next, this specification explains a second embodiment. Since the basic matters are the same as those of the first embodiment, explanations of matters described in the first embodiment are omitted.

The basic manufacturing method and structure are the same as those shown in FIG. 1 to FIG. 10 of the first embodiment. Thus, FIG. 1 to FIG. 10 are referred to in the following descriptions.

In the first embodiment, the portion of the channel area 31a parallel to a side surface of the trench 33 has a channel plane orientation of {110}. However, in general, the electron mobility in the channel area 31a formed of silicon is larger when the channel plane orientation is {100} than when the channel plane orientation is {110}. In the present embodiment, the portion of a channel area 31a parallel to a side surface of a trench 33 has a channel plane orientation of {100}. The structure of the buried-gate MOS transistor of the present embodiment is explained in detail below.

In a manner similar to the first embodiment, the main surface of a semiconductor substrate 30 has a crystal plane orientation of {100} in the present embodiment. In other words, the crystal orientation of the direction perpendicular to the main surface of the semiconductor substrate 30 is <100>.

In the present embodiment, the portion of the channel area 31a parallel to a side surface of the trench 33 has a channel plane orientation of {100} and has a channel orientation of <100> in the channel length direction. In other words, when x-, y- and z-axes (the z-axis being perpendicular to the paper plane) are defined as shown in FIG. 8, the portion of the channel area 31a parallel to a side surface of the trench 33 has a crystal orientation of <100> x-axially. The portion of the channel area 31a parallel to a side surface of the trench 33 has a crystal orientation of <100> y-axially.

In the present embodiment, the tensile stress in the channel length direction and the tensile stress in the channel width direction are applied to the portion of the channel area 31a parallel to a side surface of the trench 33. In other words, the y- and z-axial tensile stresses are applied to the portion of the channel area 31a parallel to a side surface of the trench 33. The compressive stress in a direction perpendicular to a side surface of the trench 33 is applied to the portion of the channel area 31a parallel to a side surface of the trench 33. In other words, the x-axial compressive stress is applied to the portion of the channel area 31a parallel to a side surface of the trench 33.

In the present embodiment, the electron mobility in the channel area 31a can be further enhanced by adopting the above structure.

To apply stress to the channel area 31a in the above manner, the following structure is employed in the present embodiment.

A gate electrode 42 preferably has compressive stress. In other words, the gate electrode 42 preferably has compressive stress in both a body portion 42a (formed of tungsten (W)) and a barrier metal portion 42b (formed of a titanium nitride (TiN)). A cap portion 50 also preferably has compressive stress.

Figure 15:
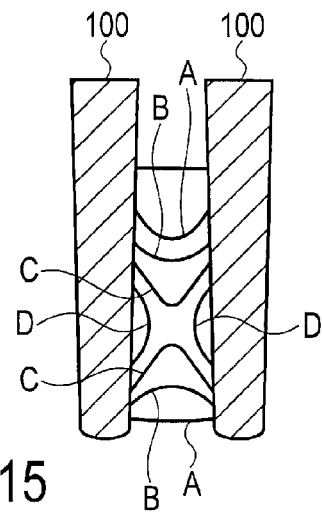
FIG. 15 shows a simulation result of stress applied to the channel area of the buried-gate MOS transistor according to the second embodiment.

FIG. 15 shows a simulation result of stress applied to the channel area (in other words, stress in the channel length direction) in the structure of the present embodiment. In a manner similar to the first embodiment, FIG. 15 assumes a structure (a gate structure 100) comprising a gate electrode and a cap portion formed on the gate electrode. FIG. 15 shows a simulation result of stress applied to the semiconductor area between the gate structures 100. The stress distribution is shown by four levels of A, B, C and D. In order to explain the degree of the stress amount and the direction, these four stress levels are defined to shift from compressive stress to tensile stress in the order of A, B, C and D.

As shown in FIG. 15, in the structure of the present embodiment, the tensile stress in the channel area can be increased. Thus, the electron mobility in the channel area can be enhanced.

To control the stress applied in the channel width direction of the channel area, the stress of an isolation area 32 should be preferably controlled. Specifically, if the isolation area 32 has compressive stress, it is possible to apply tensile stress in the channel width direction of the channel area.

When the buried-gate MOS transistor of the present embodiment is produced, the transistor may be manufactured in a state where the current semiconductor wafer is rotated 45 degrees from the regular position. In other words, the transistor may be manufactured in a state where the notch is rotated 45 degrees from the regular position. Alternatively, the transistor may be manufactured by preparing and using a semiconductor wafer in which the position of the notch is rotated 45 degrees relative to the current semiconductor wafer.

As described above, according the present embodiment, the electron mobility and the current driving performance can be enhanced by appropriately applying stress to the channel area in the buried-gate MOS transistor.

Embodiment 3

Now, this specification explains a third embodiment. Since the basic matters are the same as those of the first embodiment, explanations of matters described in the first embodiment are omitted.

The present embodiment relates to a structure for reducing the contact resistance between a source/drain area and a source/drain electrode.

In general, the band gap of a semiconductor changes in accordance with applied stress. For example, in silicon, when compressive stress (biaxial compressive stress) is applied, the band gap widens. When tensile stress (biaxial tensile stress) is applied, the band gap narrows. Thus, by applying tensile stress to the source/drain area, the band gap narrows, and the Schottky barrier in the interface between the source/drain area and the source/drain electrode is decreased. As a result, the contact resistance between the source/drain area and the source/drain electrode may be reduced.

Figure 16:
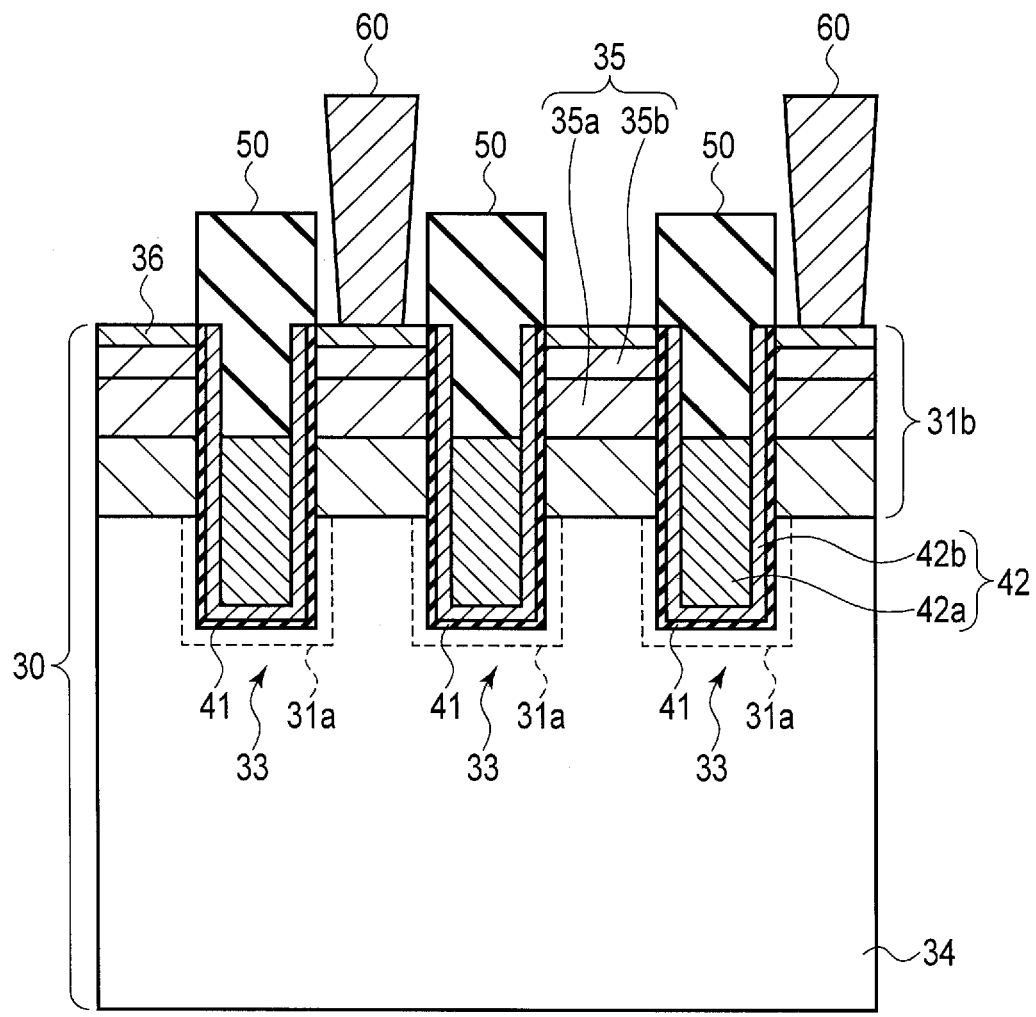
FIG. 16 is a cross-sectional view schematically showing the structure of a semiconductor device (buried-gate MOS transistor) according to a third embodiment.

FIG. 16 is a cross-sectional view schematically showing the structure of a semiconductor device (buried-gate MOS transistor) according to the present embodiment. The basic structures are the same as those of the first embodiment. Thus, structural elements corresponding to the structural elements shown in FIG. 8 of the first embodiment are designated by reference numbers corresponding to the structural elements shown in FIG. 8.

As shown in FIG. 16, a semiconductor substrate 30 includes a silicon substrate 34, a SiGe layer 35 provided on the silicon substrate 34 and a strained silicon layer 36 provided on the SiGe layer 35. The main surface of the silicon substrate 34 has a plane orientation of {100}. The SiGe layer 35 includes a SiGe-SRB (Stress Relaxed Buffer) layer 35a and a relaxed SiGe layer 35b. In the SiGe-SRB layer 35a, the Ge concentration is higher in the upper part than the lower part of the layer. Since the lattice constant of Ge is greater than that of Si, tensile stress is applied to the strained silicon layer 36 formed on the SiGe layer 35.

A source/drain electrode 60 is formed on a source/drain area 31b. A Schottky barrier is formed in the interface between the source/drain area 31b and the source/drain electrode 60. The lowest layer of the source/drain area 31b is the silicon substrate 34. The SiGe layer 35 is formed on the silicon substrate 34. Thus, the interface between the silicon substrate 34 and the SiGe layer 35 is present in the source/drain area 31b.

FIG. 17 is a cross-sectional view schematically showing a method for manufacturing the semiconductor device of the present embodiment; in particular, a method for manufacturing the semiconductor substrate 30.

As shown in FIG. 17, the SiGe layer 35 (the SiGe-SRB layer 35a and the relaxed SiGe layer 35b) is formed on the silicon substrate 34. In the upper portion on the SiGe layer 35, the strained silicon layer 36 is formed. The SiGe layer 35 and the silicon layer 36 are formed by epitaxial growth. Subsequently, an upper silicon layer 37 is formed at a sufficiently low temperature on the strained silicon layer 36. The upper silicon layer 37 is a polysilicon layer or an amorphous silicon layer.

After the semiconductor substrate 30 is formed by the process of FIG. 17, a trench is formed relative to the silicon substrate 34, the SiGe layer 35, the strained silicon layer 36 and the upper silicon layer 37. A gate electrode 42 and a cap portion 50 are formed in the trench (refer to FIG. 16). Subsequently, the upper silicon layer 37 is etched back, thereby exposing the strained silicon layer 36. Further, impurity ions are implanted to form the source/drain area 31b. Subsequently, the source/drain electrode 60 is formed on the source/drain area 31b. In this manner, the structure shown in FIG. 16 is obtained.

As explained above, in the present embodiment, the source/drain electrode 60 is formed on the strained silicon layer 36 to which tensile stress is applied. Near the interface between the source/drain area 31b and the source/drain electrode 60, tensile stress (biaxial tensile stress) in a direction parallel to the interface is applied to the source/drain area 31b. Thus, the band gap of the strained silicon layer 36 of the source/drain area 31b can be narrowed. As a result, the Schottky barrier in the interface between the source/drain area 31b and the source/drain electrode 60 can be reduced. The contact resistance between the source/drain area 31b and the source/drain electrode 60 can be decreased. According to the buried-gate MOS transistor of the present embodiment, the current drive performance can be enhanced by reducing the contact resistance.

In the above structure, lattice defects called cross hatch may be caused in the interface between the silicon substrate 34 and the SiGe-SRB layer 35a. However, in the buried-gate MOS transistor shown in FIG. 16, the area in which cross hatch is generated is present inside the impurity diffusion layer of the source/drain area 31b. Thus, the transistor characteristics are hardly affected by the generation of cross hatch in a negative way such as increase in the junction leakage current.

In the present embodiment, similarly to the first and second embodiments, tensile stress in the channel length direction is preferably applied to the portion of a channel area 31a parallel to a side surface of a trench 33.

As a method for applying tensile stress to the interface of the source/drain area 31b in the present embodiment, the cap portion 50 having tensile stress may be used. By using the cap portion 50 having tensile stress, tensile stress can be applied to the interface of the source/drain area 31b.

The semiconductor device (buried-gate MOS transistor) explained in the first, second and third embodiments can be applied to a semiconductor memory device, etc. For example, the semiconductor device can be applied to a semiconductor integrated circuit device using a magnetoresistive effect element as a memory element.

In the first, second and third embodiments described above, tensile stress and compressive stress generally influence a lattice constant. When tensile stress in a certain direction is applied to a certain region, the lattice constant in the certain direction of the certain region is increased. On the other hand, when compressive stress in a certain direction is applied to a certain region, the lattice constant in the certain direction of the certain region is decreased. The lattice constant can be measured by a nano-beam diffraction (NBD) method in which information of the lattice constant is obtained from a diffraction image using an electron beam.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate having a trench and comprising an active area, the active area including a channel area formed along an inner surface of the trench and source/drain areas formed at both ends of the channel area and sandwiching the trench;
a gate insulating film formed on the inner surface of the trench; and
a gate electrode formed in the trench in which the gate insulating film is provided,
wherein:
a main surface of the semiconductor substrate has a plane orientation of {100},
a portion of the channel area parallel to a side surface of the trench has a channel plane orientation of {110} and has a channel orientation of <100> in a channel length direction,
tensile stress in the channel length direction and compressive stress in a channel width direction are applied to the portion of the channel area parallel to the side surface of the trench,
the semiconductor device further comprises an isolation area surrounding the active area, and
the isolation area has tensile stress.

2. The semiconductor device of claim 1, wherein tensile stress in a direction perpendicular to the side surface of the trench is applied to the portion of the channel area parallel to the side surface of the trench.

3. The semiconductor device of claim 1, wherein the gate electrode has compressive stress.

4. The semiconductor device of claim 1, wherein:
the gate electrode includes a body portion and a barrier metal portion, and
the body portion has compressive stress.

5. The semiconductor device of claim 1, wherein:
the gate electrode includes a body portion and a barrier metal portion, and
the barrier metal portion has compressive stress.

6. The semiconductor device of claim 1, further comprising a cap portion formed on the gate electrode,
wherein the cap portion has compressive stress.

7. The semiconductor device of claim 1, wherein:
the gate electrode includes a body portion and a barrier metal portion, and
the body portion is formed of tungsten.

8. The semiconductor device of claim 1, wherein:
the gate electrode includes a body portion and a barrier metal portion, and
the barrier metal portion is formed of titanium nitride.

9. The semiconductor device of claim 1, further comprising a cap portion formed on the gate electrode,
wherein the cap portion is formed of silicon nitride.

10. A semiconductor device comprising:
a semiconductor substrate having a trench and comprising an active area, the active area including a channel area formed along an inner surface of the trench and source/drain areas formed at both ends of the channel area and sandwiching the trench;
a gate insulating film formed on the inner surface of the trench; and
a gate electrode formed in the trench in which the gate insulating film is provided,
wherein:
a main surface of the semiconductor substrate has a plane orientation of {100},
a portion of the channel area parallel to a side surface of the trench has a channel plane orientation of {100} and has a channel orientation of <100> in a channel length direction,
tensile stress in the channel length direction and tensile stress in a channel width direction are applied to the portion of the channel area parallel to the side surface of the trench,
the semiconductor device further comprises an isolation area surrounding the active area, and
the isolation area has compressive stress.

11. The semiconductor device of claim 10, wherein compressive stress in a direction perpendicular to the side surface of the trench is applied to the portion of the channel area parallel to the side surface of the trench.

12. The semiconductor device of claim 10, wherein the gate electrode has compressive stress.

13. The semiconductor device of claim 10, wherein:
the gate electrode includes a body portion and a barrier metal portion, and
the body portion has compressive stress.

14. The semiconductor device of claim 10, wherein:
the gate electrode includes a body portion and a barrier metal portion, and
the barrier metal portion has compressive stress.

15. The semiconductor device of claim 10, further comprising a cap portion formed on the gate electrode,
wherein the cap portion has compressive stress.

16. The semiconductor device of claim 10, wherein:
the gate electrode includes a body portion and a barrier metal portion, and
the body portion is formed of tungsten.

17. The semiconductor device of claim 10, wherein:
the gate electrode includes a body portion and a barrier metal portion, and
the barrier metal portion is formed of titanium nitride.

18. The semiconductor device of claim 10, further comprising a cap portion formed on the gate electrode,
wherein the cap portion is formed of silicon nitride.

19. A semiconductor device comprising:
a semiconductor substrate having a trench and comprising an active area, the active area including a channel area formed along an inner surface of the trench and source/drain areas formed at both ends of the channel area and sandwiching the trench;
a gate insulating film formed on the inner surface of the trench;
a gate electrode formed in the trench in which the gate insulating film is provided; and
source/drain electrodes formed on the source/drain areas,
wherein:
near each of interfaces between the source/drain areas and the source/drain electrodes, tensile stress in a direction parallel to each of the interfaces is applied to each of the source/drain areas, and
the semiconductor substrate includes a silicon substrate, a SiGe layer provided on the silicon substrate, and a silicon layer provided on the SiGe layer.

20. The semiconductor device of claim 19, wherein tensile stress in a channel length direction is applied to a portion of the channel area parallel to a side surface of the trench.

21. The semiconductor device of claim 19, wherein an interface between the silicon substrate and the SiGe layer is present in each of the source/drain areas.

22. The semiconductor device of claim 19, wherein a main surface of the silicon substrate has a plane orientation of {100}.

23. The semiconductor device of claim 19, further comprising a gate cap portion formed on the gate electrode,
wherein the gate cap portion has tensile stress.

* * * * *